US008655635B2

(12) United States Patent
Noonan

(10) Patent No.: US 8,655,635 B2
(45) Date of Patent: Feb. 18, 2014

(54) CREATING AND CONTROLLING A MODEL OF A SENSOR DEVICE FOR A COMPUTER SIMULATION

(75) Inventor: Patrick Noonan, Windham, ME (US)

(73) Assignee: National Instruments Corporation, Austin, TX (US)

( * ) Notice: Subject to any disclaimer, the term of this patent is extended or adjusted under 35 U.S.C. 154(b) by 182 days.

(21) Appl. No.: 13/228,900

(22) Filed: Sep. 9, 2011

(65) Prior Publication Data

US 2013/0066619 A1 Mar. 14, 2013

(51) Int. Cl.
*G06F 17/50* (2006.01)

(52) U.S. Cl.
USPC .......................................................... 703/14

(58) Field of Classification Search
USPC .......................................................... 703/14
See application file for complete search history.

(56) References Cited

U.S. PATENT DOCUMENTS

| 5,889,685 | A | 3/1999 | Ramachandran | |
|---|---|---|---|---|
| 7,219,040 | B2 * | 5/2007 | Renou et al. | 703/6 |
| 7,675,372 | B2 | 3/2010 | Bang et al. | |
| 7,853,441 | B2 * | 12/2010 | Volponi et al. | 703/7 |
| 8,130,986 | B2 | 3/2012 | White et al. | |
| 8,417,490 | B1 * | 4/2013 | Preston et al. | 703/2 |
| 2003/0182640 | A1 * | 9/2003 | Alani et al. | 716/4 |
| 2008/0177518 | A1 * | 7/2008 | Krishnamoorthy et al. | 703/9 |
| 2010/0051794 | A1 * | 3/2010 | Rogers | 250/252.1 |

* cited by examiner

*Primary Examiner* — Dwin M Craig
(74) *Attorney, Agent, or Firm* — Meyertons Hood Kivlin Kowert & Goetzel, P.C.; Jeffrey C. Hood

(57) ABSTRACT

Various embodiments of a system and method for creating and controlling a model of a sensor device for a computer simulation are disclosed. Sensor information specifying physical properties of the sensor device may be received, and a model of the sensor device may be automatically generated using the sensor information. An electrical circuit simulation may be performed using the model of the sensor device. The system and method may enable the user to interactively change the sensor device model during the simulation. The user may interact with a graphical user interface during the simulation to provide input specifying a change in one or more physical properties of the sensor device. In response to the user input, the model of the sensor device may be dynamically modified during the simulation to simulate the change in the one or more physical properties of the sensor device.

18 Claims, 11 Drawing Sheets

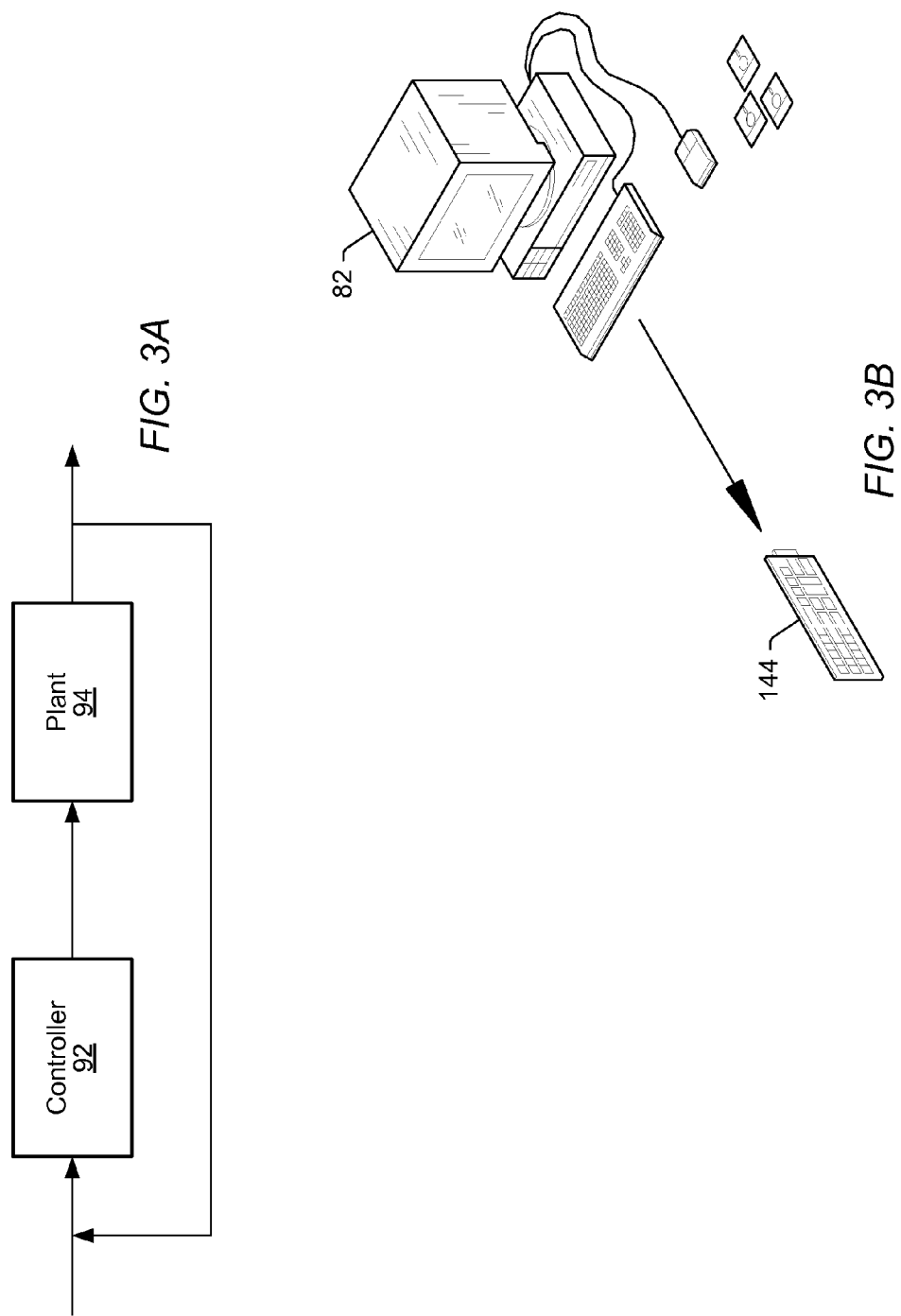

CREATING AND CONTROLLING A MODEL OF A SENSOR DEVICE FOR A COMPUTER SIMULATION

FIELD OF THE INVENTION

The present invention relates to the fields of test and measurement applications and computer simulation. More particularly, embodiments of the invention relate to a system and method for creating and controlling a model of a sensor device for a computer simulation.

DESCRIPTION OF THE RELATED ART

Circuit simulation is an important part of the design process for developing products that use electronic circuits. By simulating a circuit, the product developer can detect errors early in the process and avoid costly and time-consuming prototype re-working. Simulation can also allow the product developer to easily swap components to evaluate different product designs.

The most popular component-level circuit simulator available today is called SPICE (Simulation Program with Integrated Circuit Emphasis), which was originally developed in the 1970s. SPICE simulation employs sophisticated and proven algorithms to accurately converge on a mathematical solution for a circuit's operation. Today vendors offer many different versions of SPICE that differ mainly in the user interface but are internally very similar. The Multisim™ product available from National Instruments Corp. is one example of a software package that implements a SPICE simulation environment. Multisim abstracts the complexities and difficulties of traditional syntax-based simulation so that the user no longer needs to be an expert in SPICE to simulate and analyze circuits.

Multisim and other SPICE simulators can be used to simulate circuits used for many different kinds of applications. Many applications use sensor devices to sense a physical characteristic of a physical system or device under test and output a corresponding signal. The signal may be passed through signal conditioning circuitry and then into a computer system or device that analyzes the signal, e.g., to perform a test and measurement application or process control application.

When simulating a product or system that uses a sensor device, the developer often uses a simple component in the simulation that represents the signal generated by the sensor device as an ideal sine wave, square wave, or other mathematically generated signal. While this may be easy to implement, a simple signal of this type may not accurately represent the signal that a real sensor device would generate in a real application.

SUMMARY OF THE INVENTION

Various embodiments of a system and method for creating and controlling a model of a sensor device for a computer simulation are disclosed. The system and method may operate to receive sensor information specifying properties of the sensor device and automatically generate a model of the sensor device using the sensor information. An electrical circuit simulation may be performed using the model of the sensor device in a simulation environment, e.g., where the simulation environment is implemented by a simulation software application executing on a computer system. The automatically generated model of the sensor device may model the actual circuitry of a real sensor device. Thus, the model may produce a simulated output signal similar to the actual signal that a real sensor device would produce. In some embodiments the simulated output signal may be provided to other simulated circuitry that uses the output signal to perform various types of applications.

Further embodiments of the system and method may enable the user to interactively control or change the model of the sensor device during the simulation. During the simulation, a graphical user interface for controlling the model of the sensor device may be displayed. The user may interact with the graphical user interface during the simulation to provide input specifying a change in one or more physical properties of the sensor device. In response to the user input, the system and method may operate to dynamically modify the model of the sensor device during the simulation by adjusting the electrical circuitry represented by the model to simulate the change in the one or more physical properties of the sensor device. This may advantageously enable the user to quickly see how differences in the sensor device design would affect the application.

In some embodiments the simulation application that implements the simulation environment may communicate with another software application to implement the functionality of creating and/or changing the model of the sensor device. In some embodiments the model of the sensor device may be generated by a graphical program. The graphical program may have been developed in a graphical programming development environment, e.g., by arranging nodes or icons in a block diagram and interconnecting them so that the plurality of interconnected nodes or icons visually indicates functionality of the graphical program. In addition to possibly generating the model of the sensor device, in some embodiments the graphical program may also execute on the computer system together with the simulation application to display the graphical user interface that enables the user to specify changes to the model of the sensor device during the simulation. In response to the user input to the graphical user interface, the graphical program may communicate with the simulation application to adjust the circuitry of the sensor device model or adjust one or more electrical signals used in the circuitry to simulate the change in the sensor device specified by the user.

BRIEF DESCRIPTION OF THE DRAWINGS

A better understanding of the present invention can be obtained when the following detailed description of the preferred embodiment is considered in conjunction with the following drawings, in which:

FIG. 3A is a block diagram of a system including a controller and a plant;

FIG. 3B illustrates an example of a system that may perform control and/or simulation functions;

Figure 1:
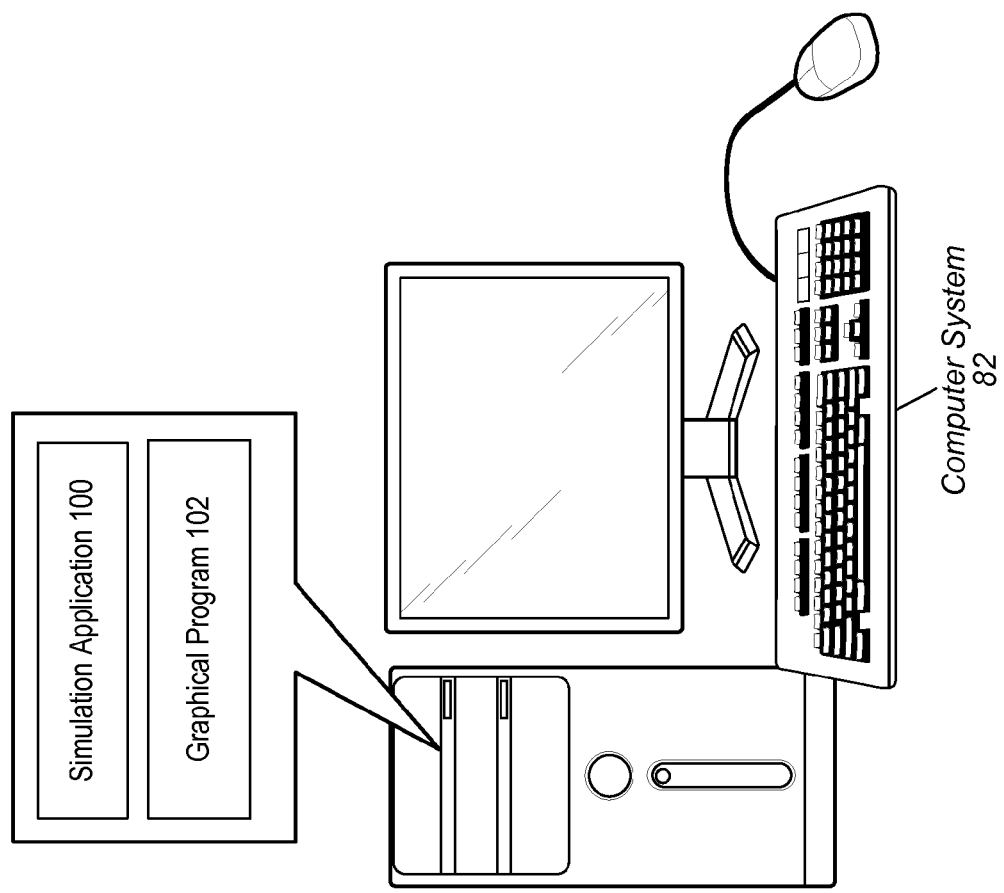
FIG. 1 illustrates a computer system configured to execute a simulation software application.

While the invention is susceptible to various modifications and alternative forms, specific embodiments thereof are shown by way of example in the drawings and are herein described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Incorporation by Reference

The following references are hereby incorporated by reference in their entirety as though fully and completely set forth herein:

U.S. Pat. No. 4,914,568 titled "Graphical System for Modeling a Process and Associated Method," issued on Apr. 3, 1990.

U.S. Pat. No. 5,481,741 titled "Method and Apparatus for Providing Attribute Nodes in a Graphical Data Flow Environment".

U.S. Pat. No. 6,173,438 titled "Embedded Graphical Programming System" filed Aug. 18, 1997.

U.S. Pat. No. 6,219,628 titled "System and Method for Configuring an Instrument to Perform Measurement Functions Utilizing Conversion of Graphical Programs into Hardware Implementations," filed Aug. 18, 1997.

U.S. Pat. No. 7,210,117 titled "System and Method for Programmatically Generating a Graphical Program in Response to Program Information," filed Dec. 20, 2000.

TERMS

The following is a glossary of terms used in the present application:

Memory Medium—Any of various types of memory devices or storage devices. The term "memory medium" is intended to include an installation medium, e.g., a CD-ROM, floppy disks 104, or tape device; a computer system memory or random access memory such as DRAM, DDR RAM, SRAM, EDO RAM, Rambus RAM, etc.; a non-volatile memory such as a Flash, magnetic media, e.g., a hard drive, or optical storage; registers, or other similar types of memory elements, etc. The memory medium may comprise other types of memory as well or combinations thereof. In addition, the memory medium may be located in a first computer in which the programs are executed, or may be located in a second different computer which connects to the first computer over a network, such as the Internet. In the latter instance, the second computer may provide program instructions to the first computer for execution. The term "memory medium" may include two or more memory mediums which may reside in different locations, e.g., in different computers that are connected over a network.

Carrier Medium—a memory medium as described above, as well as a physical transmission medium, such as a bus, network, and/or other physical transmission medium that conveys signals such as electrical, electromagnetic, or digital signals.

Programmable Hardware Element—includes various hardware devices comprising multiple programmable function blocks connected via a programmable interconnect. Examples include FPGAs (Field Programmable Gate Arrays), PLDs (Programmable Logic Devices), FPOAs (Field Programmable Object Arrays), and CPLDs (Complex PLDs). The programmable function blocks may range from fine grained (combinatorial logic or look up tables) to coarse grained (arithmetic logic units or processor cores). A programmable hardware element may also be referred to as "reconfigurable logic".

Software Program—the term "software program" is intended to have the full breadth of its ordinary meaning, and includes any type of program instructions, code, script and/or data, or combinations thereof, that may be stored in a memory medium and executed by a processor. Exemplary software programs include programs written in text-based programming languages, such as C, C++, PASCAL, FORTRAN, COBOL, JAVA, assembly language, etc.; graphical programs (programs written in graphical programming languages); assembly language programs; programs that have been compiled to machine language; scripts; and other types of executable software. A software program may comprise two or more software programs that interoperate in some manner. Note that various embodiments described herein may be implemented by a computer or software program. A software program may be stored as program instructions on a memory medium.

Hardware Configuration Program—a program, e.g., a netlist or bit file, that can be used to program or configure a programmable hardware element.

Program—the term "program" is intended to have the full breadth of its ordinary meaning. The term "program" includes 1) a software program which may be stored in a memory and is executable by a processor or 2) a hardware configuration program useable for configuring a programmable hardware element.

Graphical Program—A program comprising a plurality of interconnected nodes or icons, wherein the plurality of interconnected nodes or icons visually indicate functionality of the program. The interconnected nodes or icons are graphical source code for the program. Graphical function nodes may also be referred to as blocks.

The following provides examples of various aspects of graphical programs. The following examples and discussion are not intended to limit the above definition of graphical program, but rather provide examples of what the term "graphical program" encompasses:

The nodes in a graphical program may be connected in one or more of a data flow, control flow, and/or execution flow format. The nodes may also be connected in a "signal flow" format, which is a subset of data flow.

Exemplary graphical program development environments which may be used to create graphical programs include LabVIEW®, DasyLab™, DiaDem™ and Matrixx/SystemBuild™ from National Instruments, Simulink® from the MathWorks, VEE™ from Agilent, WiT™ from Coreco, Vision Program Manager™ from PPT Vision, SoftWIRE™ from Measurement Computing, Sanscript™ from Northwoods Software, Khoros™ from Khoral Research, SnapMaster™ from HEM Data, VisSim™ from Visual Solutions, ObjectBench™ by SES (Scientific and Engineering Software), and VisiDAQ™ from Advantech, among others.

The term "graphical program" includes models or block diagrams created in graphical modeling environments, wherein the model or block diagram comprises interconnected blocks (i.e., nodes) or icons that visually indicate operation of the model or block diagram; exemplary graphical modeling environments include Simulink®, SystemBuild™, VisSim™, Hypersignal Block Diagram™, etc.

A graphical program may be represented in the memory of the computer system as data structures and/or program instructions. The graphical program, e.g., these data structures and/or program instructions, may be compiled or interpreted to produce machine language that accomplishes the desired method or process as shown in the graphical program.

Input data to a graphical program may be received from any of various sources, such as from a device, unit under test, a process being measured or controlled, another computer program, a database, or from a file. Also, a user may input data to a graphical program or virtual instrument using a graphical user interface, e.g., a front panel.

A graphical program may optionally have a GUI associated with the graphical program. In this case, the plurality of interconnected blocks or nodes are often referred to as the block diagram portion of the graphical program.

Node—In the context of a graphical program, an element that may be included in a graphical program. The graphical program nodes (or simply nodes) in a graphical program may also be referred to as blocks. A node may have an associated icon that represents the node in the graphical program, as well as underlying code and/or data that implements functionality of the node. Exemplary nodes (or blocks) include function nodes, sub-program nodes, terminal nodes, structure nodes, etc. Nodes may be connected together in a graphical program by connection icons or wires.

Data Flow Program—A Software Program in which the program architecture is that of a directed graph specifying the flow of data through the program, and thus functions execute whenever the necessary input data are available. Data flow programs can be contrasted with procedural programs, which specify an execution flow of computations to be performed. As used herein "data flow" or "data flow programs" refer to "dynamically-scheduled data flow" and/or "statically-defined data flow".

Graphical Data Flow Program (or Graphical Data Flow Diagram)—A Graphical Program which is also a Data Flow Program. A Graphical Data Flow Program comprises a plurality of interconnected nodes (blocks), wherein at least a subset of the connections among the nodes visually indicate that data produced by one node is used by another node. A LabVIEW VI is one example of a graphical data flow program. A Simulink block diagram is another example of a graphical data flow program.

Graphical User Interface—this term is intended to have the full breadth of its ordinary meaning. The term "Graphical User Interface" is often abbreviated to "GUI". A GUI may comprise only one or more input GUI elements, only one or more output GUI elements, or both input and output GUI elements.

The following provides examples of various aspects of GUIs. The following examples and discussion are not intended to limit the ordinary meaning of GUI, but rather provide examples of what the term "graphical user interface" encompasses:

A GUI may comprise a single window having one or more GUI Elements, or may comprise a plurality of individual GUI Elements (or individual windows each having one or more GUI Elements), wherein the individual GUI Elements or windows may optionally be tiled together.

A GUI may be associated with a graphical program. In this instance, various mechanisms may be used to connect GUI Elements in the GUI with nodes in the graphical program. For example, when Input Controls and Output Indicators are created in the GUI, corresponding nodes (e.g., terminals) may be automatically created in the graphical program or block diagram. Alternatively, the user can place terminal nodes in the block diagram which may cause the display of corresponding GUI Elements front panel objects in the GUI, either at edit time or later at run time. As another example, the GUI may comprise GUI Elements embedded in the block diagram portion of the graphical program.

Front Panel—A Graphical User Interface that includes input controls and output indicators, and which enables a user to interactively control or manipulate the input being provided to a program, and view output of the program, while the program is executing.

A front panel is a type of GUI. A front panel may be associated with a graphical program as described above.

In an instrumentation application, the front panel can be analogized to the front panel of an instrument. In an industrial automation application the front panel can be analogized to the MMI (Man Machine Interface) of a device. The user may adjust the controls on the front panel to affect the input and view the output on the respective indicators.

Graphical User Interface Element—an element of a graphical user interface, such as for providing input or displaying output. Exemplary graphical user interface elements comprise input controls and output indicators.

Input Control—a graphical user interface element for providing user input to a program. An input control displays the value input by the user and is capable of being manipulated at the discretion of the user. Exemplary input controls comprise dials, knobs, sliders, input text boxes, etc.

Output Indicator—a graphical user interface element for displaying output from a program. Exemplary output indicators include charts, graphs, gauges, output text boxes, numeric displays, etc. An output indicator is sometimes referred to as an "output control".

Computer System—any of various types of computing or processing systems, including a personal computer system (PC), mainframe computer system, workstation, network appliance, Internet appliance, personal digital assistant (PDA), television system, grid computing system, or other device or combinations of devices. In general, the term "computer system" can be broadly defined to encompass any device (or combination of devices) having at least one processor that executes instructions from a memory medium.

Measurement Device—includes instruments, data acquisition devices, smart sensors, and any of various types of devices that are configured to acquire and/or store data. A measurement device may also optionally be further configured to analyze or process the acquired or stored data. Examples of a measurement device include an instrument, such as a traditional stand-alone "box" instrument, a computer-based instrument (instrument on a card) or external instrument, a data acquisition card, a device external to a computer that operates similarly to a data acquisition card, one or more DAQ or measurement cards or modules in a chassis, an image acquisition device, such as an image acquisition (or machine vision) card (also called a video capture board) or smart camera, a motion control device, a robot having machine vision, and other similar types of devices. Exemplary "stand-alone" instruments include oscilloscopes, multimeters, signal analyzers, arbitrary waveform generators, spectroscopes, and similar measurement, test, or automation instruments.

A measurement device may be further configured to perform control functions, e.g., in response to analysis of the acquired or stored data. For example, the measurement device may send a control signal to an external system, such as a motion control system or to a sensor, in response to particular data. A measurement device may also be configured to perform automation functions, i.e., may receive and analyze data, and issue automation control signals in response.

Sensor Device—a device configured to sense one or more physical characteristics of a physical system or device under test and output a corresponding signal. Different kinds of sensor devices may sense any of various kinds of physical characteristics. Examples of sensor devices include strain gauge devices, thermocouple devices, thermistor devices, accelerometer devices, load cell devices, and light sensor devices, among others. Sensor devices may be used in conjunction with measurement devices and other devices to implement test and measurement applications and process control applications. For example, a sensor device may output an electrical signal which may be passed through signal conditioning circuitry and then into a computer or device that analyzes the signal.

Automatically—refers to an action or operation performed by a computer system (e.g., software executed by the computer system) or device (e.g., circuitry, programmable hardware elements, ASICs, etc.), without user input directly specifying or performing the action or operation. Thus the term "automatically" is in contrast to an operation being manually performed or specified by the user, where the user provides input to directly perform the operation. An automatic procedure may be initiated by input provided by the user, but the subsequent actions that are performed "automatically" are not specified by the user, i.e., are not performed "manually", where the user specifies each action to perform. For example, a user filling out an electronic form by selecting each field and providing input specifying information (e.g., by typing information, selecting check boxes, radio selections, etc.) is filling out the form manually, even though the computer system must update the form in response to the user actions. The form may be automatically filled out by the computer system where the computer system (e.g., software executing on the computer system) analyzes the fields of the form and fills in the form without any user input specifying the answers to the fields. As indicated above, the user may invoke the automatic filling of the form, but is not involved in the actual filling of the form (e.g., the user is not manually specifying answers to fields but rather they are being automatically completed). The present specification provides various examples of operations being automatically performed in response to actions the user has taken.

Various embodiments of a system and method for creating and controlling a model of a sensor device for a computer simulation are disclosed. The system and method may operate to receive sensor information specifying properties of the sensor device and automatically generate a model of the sensor device using the sensor information. An electrical circuit simulation may be performed using the model of the sensor device in a simulation environment, e.g., where the simulation environment is implemented by a simulation software application executing on a computer system. The automatically generated model of the sensor device may model the actual circuitry of a real sensor device. Thus, the model may produce a simulated output signal similar to the actual signal that a real sensor device would produce. The simulated output signal can be provided to other simulated circuitry that uses the output signal to perform various types of applications. As mentioned above, in conventional simulations the signal produced by a sensor device is often represented as an ideal sine wave, square wave, or other mathematically produced signal, which may not accurately represent the signal that a real sensor device would produce in a real application. Using an accurate model of the sensor device that produces a more accurate output signal may thus help a user (e.g., a developer of a product or system) to prototype and test a design more accurately.

Further embodiments of the system and method may enable the user to interactively control or change the model of the sensor device during the simulation. During the simulation, a graphical user interface for controlling the model of the sensor device may be displayed. The user may interact with the graphical user interface during the simulation to provide input specifying a change in one or more physical properties of the sensor device. In response to the user input, the system and method may operate to dynamically modify the model of the sensor device during the simulation by adjusting the electrical circuitry represented by the model to simulate the change in the one or more of physical properties of the sensor device. This may advantageously enable the user to quickly see how differences in the sensor device design would affect the application.

FIG. 1 illustrates a computer system 82 configured to execute a simulation software application 100. The simulation application 100 may implement a simulation environment in which the simulation can be performed. In various embodiments, different kinds of simulation environments may be used to perform the simulation. The system and method may thus operate to generate different kinds of sensor device models depending upon which simulation application 100 is used. In some embodiments the simulation application 100 may implement a SPICE simulation environment, and the automatically generated model may be a SPICE model of the sensor device. The term "SPICE model" may refer to a model that can be used in a simulation application that implements any version, variation, or extension of SPICE. In some embodiments the simulation environment may be implemented by a Multisim™ software application available from National Instruments Corp.

In some embodiments the simulation application 100 may communicate with another software application to implement the functionality described herein. For example, the model of the sensor device may be automatically generated by the simulation application 100 or by another software application. In particular, in some embodiments the model of the sensor device may be generated by a graphical program 102 executing on the computer system 82. The graphical program may have been developed in a graphical programming development environment, e.g., by arranging nodes or icons in a block diagram and interconnecting them so that the plurality of interconnected nodes or icons visually indicates functionality of the graphical program. In addition to possibly generating the model of the sensor device, in some embodiments the graphical program 102 may also execute on the computer system 82 together with the simulation application 100 to display the graphical user interface that enables the user to specify changes to the model of the sensor device during the simulation. In response to the user input to the graphical user interface, the graphical program 102 may communicate with the simulation application 100 to adjust the circuitry or one or more electrical signals used in the circuitry to simulate the change in the sensor device specified by the user. As FIG. 1, the computer system 82 may include a display device configured to display the graphical user interface during the simulation.

In various embodiments the graphical program 102 may be any kind of graphical program developed using any graphical program development environment. In some embodiments the graphical program may be a LabVIEW™ virtual instrument (VI) developed using a LabVIEW™ software application from National Instruments Corp.

Exemplary Systems

Embodiments of the present system and method may be used for performing test and/or measurement functions; controlling and/or modeling instrumentation or industrial automation hardware; modeling and simulation functions, e.g., modeling or simulating a device or product being developed or tested, etc. Examples of test applications include hardware-in-the-loop testing and rapid control prototyping, among others.

Figure 2A:
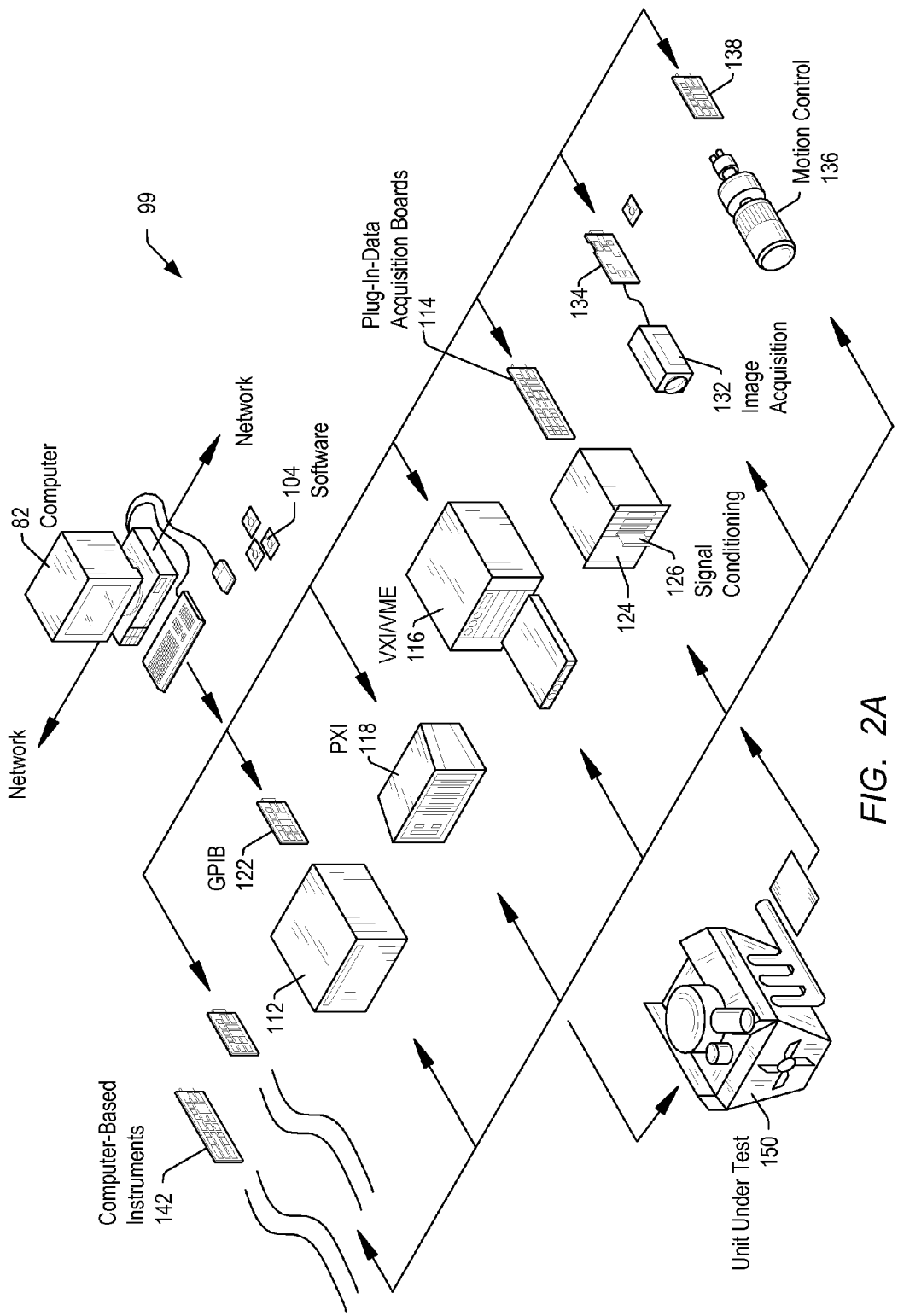
FIG. 2A illustrates an example of an instrumentation control system.

FIG. 2A illustrates an example of an instrumentation control system 99 that may implement the functionality described herein. The system 99 includes a host computer 82 that in some embodiments couples to one or more instruments. The host computer 82 may include a CPU, a display screen, memory, and one or more input devices such as a mouse or keyboard. In some embodiments the computer 82 may operate with the one or more instruments to analyze, measure or control a unit under test (UUT) or process 150.

The one or more instruments may include a GPIB instrument 112 and associated GPIB interface card 122, a data acquisition board 114 inserted into or otherwise coupled with chassis 124 with associated signal conditioning circuitry 126, a VXI instrument 116, a PXI instrument 118, a video device or camera 132 and associated image acquisition (or machine vision) card 134, a motion control device 136 and associated motion control interface card 138, and/or one or more computer based instrument cards 142, among other types of devices. The computer system may couple to and operate with one or more of these instruments.

The instruments may receive signals produced by one or more sensor devices coupled to the unit under test (UUT) or process 150. In some embodiments the operation of the system 99 may be at least partially simulated by the simulation application 100. For example, in some embodiments one or more real instruments such as shown in FIG. 2A may receive a signal generated by a model of a sensor device being simulated by the simulation application 100. In other embodiments the instruments themselves may also be simulated, e.g., so that the entire system 99 is a virtual system without physical instantiation other than the computer system 82 which executes the simulation application 100.

Figure 2B:
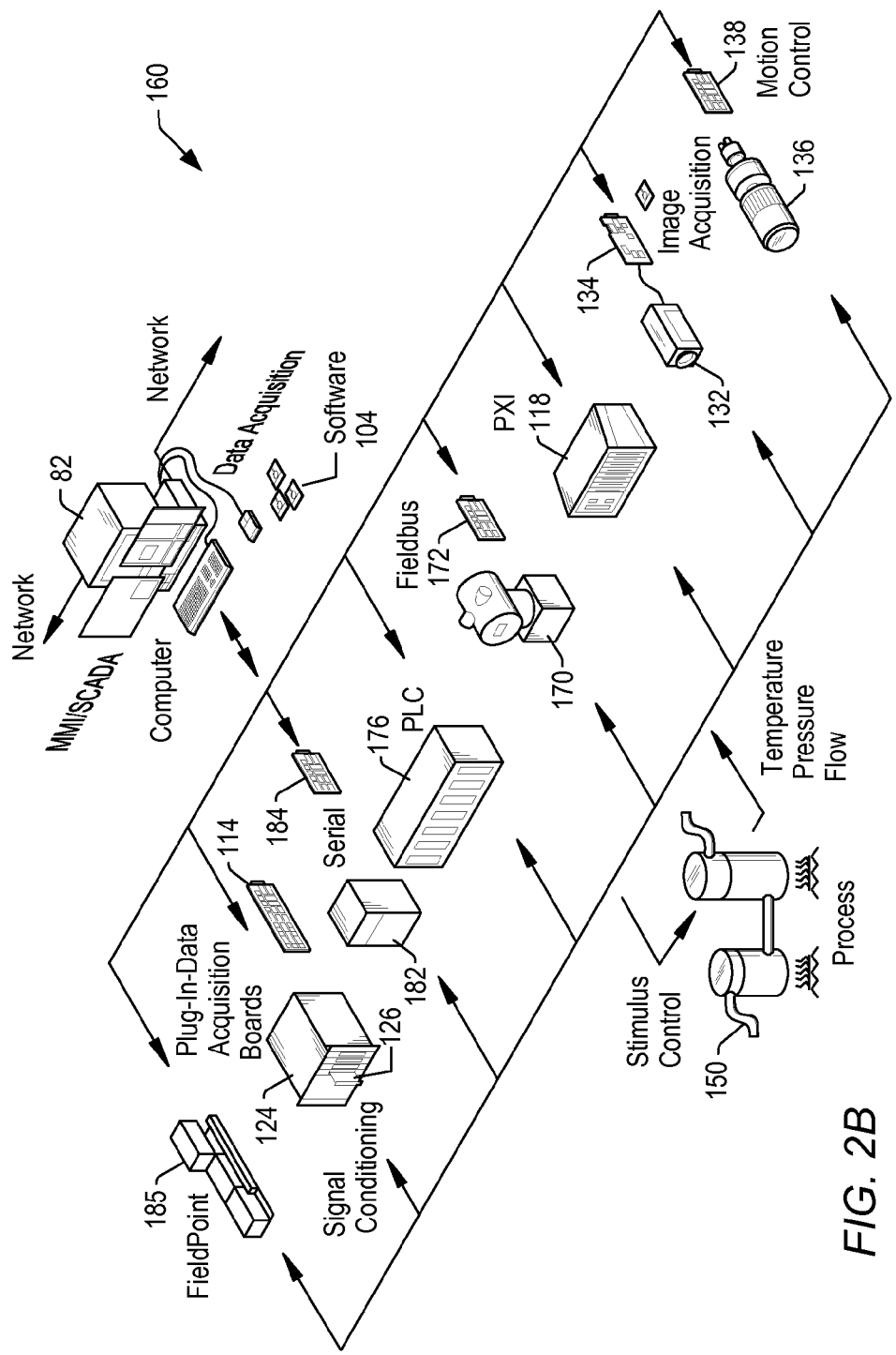
FIG. 2B illustrates an example of an industrial automation system.

FIG. 2B illustrates an example of an industrial automation system 160 that may implement the functionality described herein. The industrial automation system 160 is similar to the instrumentation or test and measurement system 99 shown in FIG. 2A. Elements that are similar or identical to elements in FIG. 2A have the same reference numerals for convenience. The system 160 may include a computer 82 that couples to one or more devices or instruments. The computer 82 may include a CPU, a display screen, memory, and one or more input devices such as a mouse or keyboard. The computer 82 may operate with the one or more devices to perform an automation function with respect to a process or device 150, such as MMI (Man Machine Interface), SCADA (Supervisory Control and Data Acquisition), portable or distributed data acquisition, process control, advanced analysis, or other control, among others.

The one or more devices may include a data acquisition board 114 inserted into or otherwise coupled with chassis 124 with associated signal conditioning circuitry 126, a PXI instrument 118, a video device 132 and associated image acquisition card 134, a motion control device 136 and associated motion control interface card 138, a fieldbus device 170 and associated fieldbus interface card 172, a PLC (Programmable Logic Controller) 176, a serial instrument 182 and associated serial interface card 184, or a distributed data acquisition system, such as the Fieldpoint system available from National Instruments, among other types of devices.

Similarly as described above, in some embodiments the operation of the industrial automation system 160 may be at least partially simulated by the simulation application 100, e.g., where the simulation application uses a model of one or more sensor devices of the industrial automation system 160.

FIG. 3A is a high-level block diagram of a system which may be simulated. FIG. 3A illustrates a general high-level block diagram including a controller 92 and a plant 94. The controller 92 represents a control system/algorithm the user may be trying to develop. The plant 94 represents the system the user may be trying to control. For example, if the user is designing an engine control unit (ECU) for a car, the controller 92 may be the ECU and the plant 94 may be the car's engine (and possibly other components such as transmission, brakes, and so on.) In some embodiments a user may create a graphical program (which may be a different graphical program than the graphical program 102 shown in FIG. 1) that implements or simulates the functionality of one or both of the controller 92 and the plant 94. In some embodiments the graphical program may execute in conjunction with the simulation application 100. For example, the simulation application 100 may use the model of the sensor device to produce an output signal which is provided to the graphical program that implements or simulates the functionality of one or both of the controller 92 and the plant 94.

FIG. 3B illustrates an example of a system that may perform control and/or simulation functions. The controller 92 may be implemented or simulated by a computer system 82 or other device (e.g., including a processor and memory medium and/or including a programmable hardware element) that executes or implements a graphical program. In a similar manner, the plant 94 may be implemented or simulated by a computer system or other device 144 (e.g., including a processor and memory medium and/or including a programmable hardware element) that executes or implements a graphical program, or may be implemented in or as a real physical system, e.g., a car engine.

In some embodiments, one or more graphical programs may be created which are used in performing rapid control prototyping. Rapid Control Prototyping (RCP) generally refers to the process by which a user develops a control algorithm and quickly executes that algorithm on a target controller connected to a real system. The user may develop the control algorithm using a graphical program, and the graphical program may execute on the controller 92, e.g., on a computer system or other device. The computer system 82 may be a platform that supports real time execution, e.g., a device including a processor that executes a real time operating system (RTOS), or a device including a programmable hardware element.

In some embodiments, one or more graphical programs may be created which are used in performing Hardware in the Loop (HIL) simulation. Hardware in the Loop (HIL) refers to the execution of the plant model 94 in real time to test operation of a real controller 92. For example, once the controller 92 has been designed, it may be expensive and complicated to actually test the controller 92 thoroughly in a real plant, e.g., a real car. Thus, the plant model (implemented by a graphical program) is executed in real time to make the real controller 92 "believe" or operate as if it is connected to a real plant, e.g., a real engine.

In some embodiments of the systems shown in FIGS. 2A, 2B, and 3B, various devices may couple to each other over a network, such as the Internet or a local area network (LAN). In some embodiments the user may select a target device from a plurality of possible target devices for programming or configuration using a graphical program. Thus the user may create a graphical program on a computer and use (execute) the graphical program on that computer or deploy the graphical program to a target device (for remote execution on the target device) that is remotely located from the computer and coupled to the computer through a network.

Graphical software programs that perform data acquisition, analysis and/or presentation, e.g., for measurement, instrumentation control, industrial automation, modeling, or simulation, such as in the applications shown in FIGS. 2A and 2B, may be referred to as virtual instruments.

Figure 4:
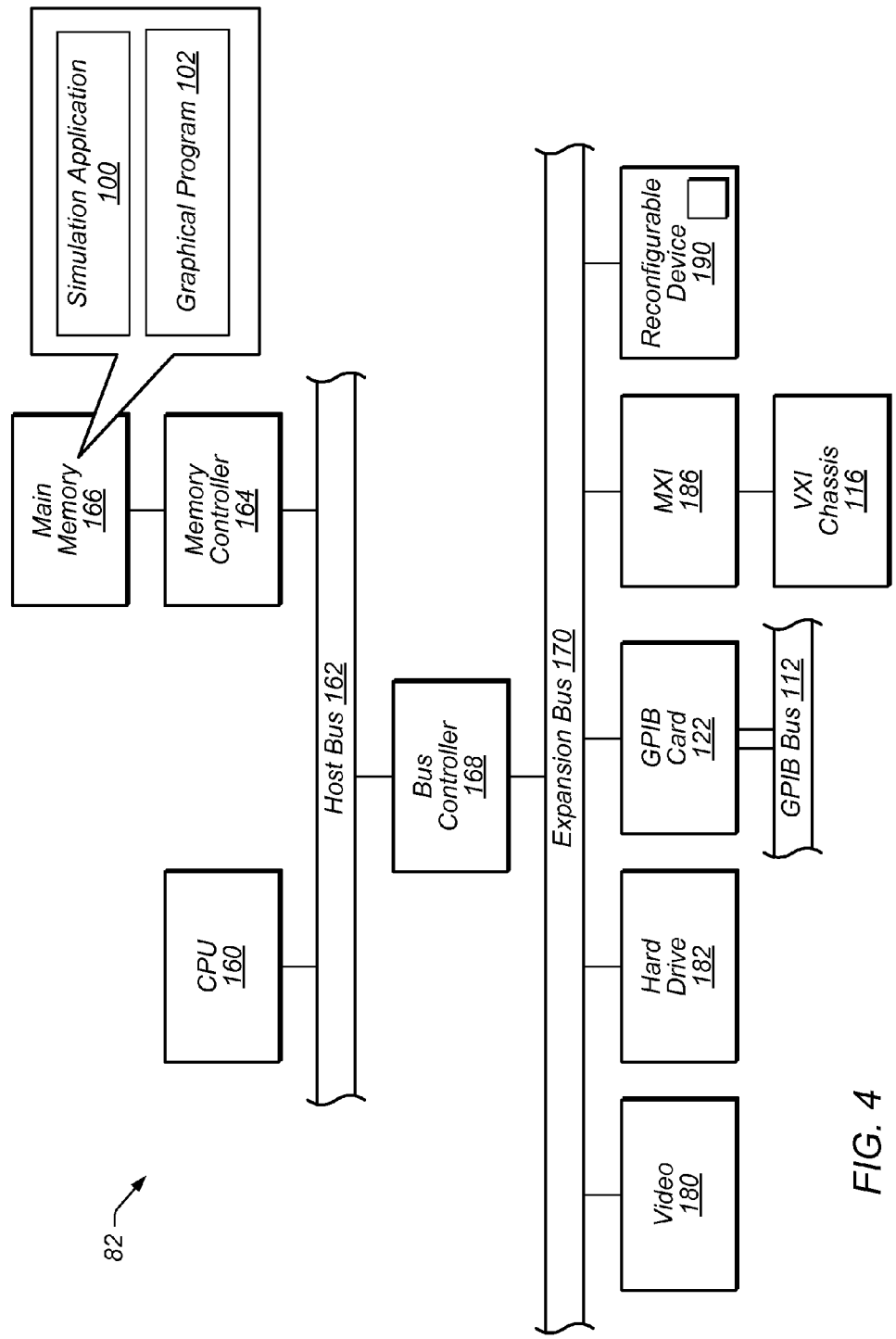
FIG. 4 is a block diagram representing one embodiment of a computer system.

FIG. 4—Computer System Block Diagram

FIG. 4 is a block diagram representing one embodiment of a computer system 82 such as illustrated in FIG. 1, FIG. 2A, FIG. 2B and/or FIG. 3B. It is noted that any type of computer system configuration or architecture can be used in various embodiments, and FIG. 4 illustrates a representative PC embodiment. It is also noted that the computer system 82 may be a general purpose computer system, a computer implemented on a card installed in a chassis, or other types of embodiments. Elements of a computer not necessary to understand the present description have been omitted for simplicity.

The computer system 82 may include at least one central processing unit or CPU (processor) 160 which is coupled to a processor or host bus 162. The CPU 160 may be any of various types, including an x86 processor, e.g., a Pentium class, a PowerPC processor, a CPU from the SPARC family of RISC processors, as well as others. A memory medium, typically comprising RAM and referred to as main memory, 166 is coupled to the host bus 162 by means of memory controller 164. The main memory 166 may store the software implementing the simulation application 100. In some embodiments the main memory 166 may also store a graphical program 102 that executes in conjunction with the simulation application 100. In some embodiments the main memory 166 may also store software of a graphical program development environment used to create the graphical program 102 and/or provide a runtime environment for the graphical program 102. The main memory 166 may also store operating system software, as well as other software for operation of the computer system.

The host bus 162 may be coupled to an expansion or input/output bus 170 by means of a bus controller 168 or bus bridge logic. The expansion bus 170 may be the PCI (Peripheral Component Interconnect) expansion bus, although other bus types can be used. The expansion bus 170 includes slots for various devices such as described above. The computer 82 further comprises a video display subsystem 180 and hard drive 182 coupled to the expansion bus 170. The computer 82 may also comprise a GPIB card 122 coupled to a GPIB bus 112, and/or an MXI device 186 coupled to a VXI chassis 116.

As shown, a device 190 may also be connected to the computer. The device 190 may include a processor and memory which may execute a real time operating system. The device 190 may also or instead comprise a programmable hardware element. In some embodiments the computer system may be configured to deploy a graphical program to the device 190 for execution of the graphical program on the device 190. The deployed graphical program may take the form of graphical program instructions or data structures that directly represents the graphical program. Alternatively, the deployed graphical program may take the form of text code (e.g., C code) generated from the graphical program. As another example, the deployed graphical program may take the form of compiled code generated from either the graphical program or from text code that in turn was generated from the graphical program.

Figure 5:
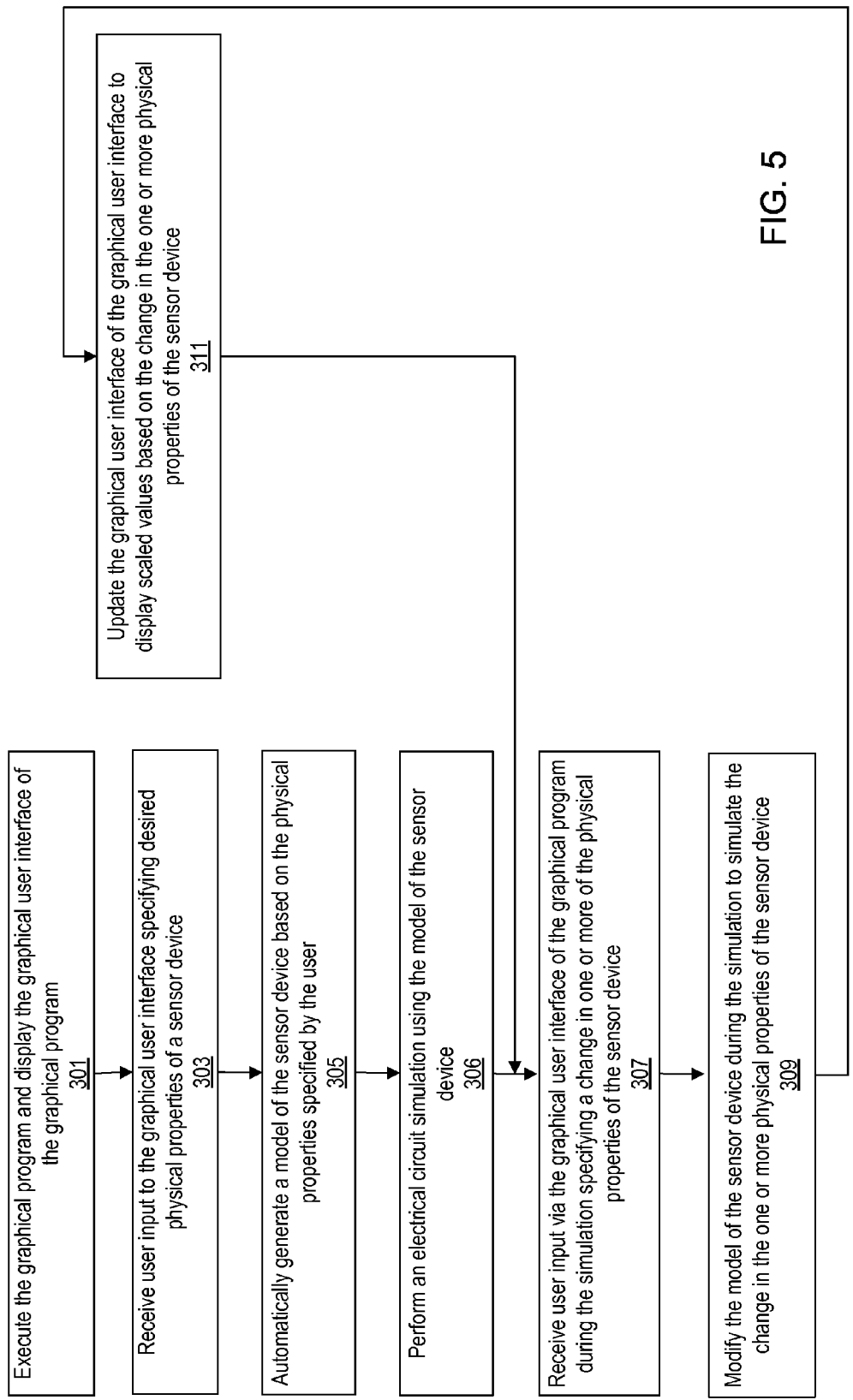
FIG. 5 is a flowchart diagram illustrating one embodiment of a method for creating and controlling a model of a sensor device for a computer simulation.

FIG. 5 is a flowchart diagram illustrating one embodiment of a method for creating and controlling a model of a sensor device for a computer simulation. The method may be implemented by software executing on a computer system, such as the simulation application 100 and graphical program 102 executing on the computer system 82.

In some embodiments the model of the sensor device may be created by the graphical program 102. As indicated in block 301, the graphical program 102 may be executed on the computer system. The graphical program may display a graphical user interface on the display of the computer system. In block 303, the user may provide input to the graphical user interface to specify the desired physical properties of the sensor device. In block 305, the graphical program 102 may execute to automatically generate a model of the sensor device based on the physical properties specified by the user.

Figure 6:
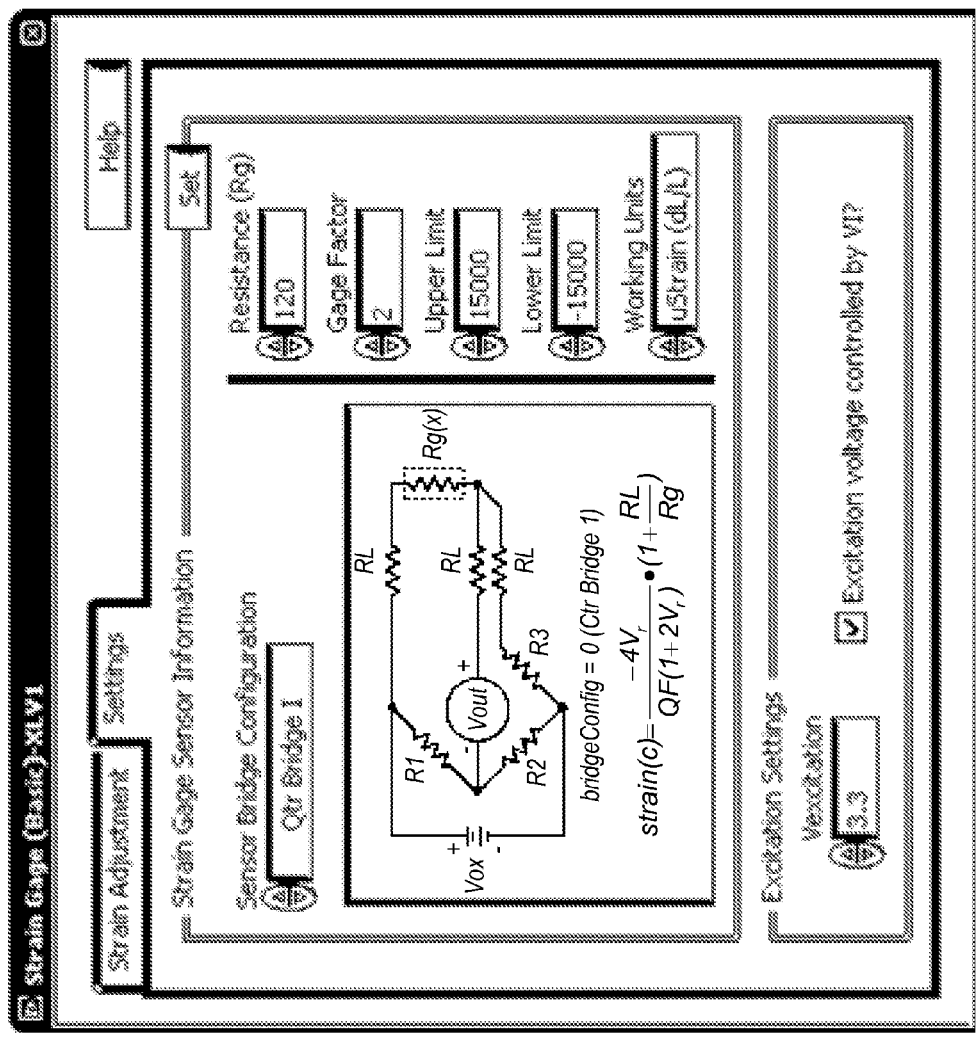
FIG. 6 illustrates an example of a graphical user interface enabling the user to specify physical properties of a strain gauge device to be modeled.

In various embodiments the graphical program 102 may be configured to automatically generate a model of any of various kinds of sensor devices. For example, the graphical user interface of the graphical program may enable the user to specify desired physical properties of a strain gauge device, thermocouple device, thermistor device, accelerometer device, load cell device, light sensor device, or other sensor device. The physical properties that the user can specify via the graphical user interface can vary depending on the kind of sensor device. For example, FIG. 6 illustrates an example of a graphical user interface enabling the user to specify physical properties of a strain gauge device, such as the nominal resistance (Rg) value, gage factor, upper and lower limits of strain, etc. The graphical user interface may also enable the user to select from a plurality of sensor types for the sensor device. For example, the graphical user interface of FIG. 6 enables the user to select from a plurality of strain gauge types, such as a quarter bridge configuration, half-bridge configuration, or full bridge configuration.

Thus, the graphical user interface may enable the user to specify a desired configuration of the sensor device in terms of physical properties and units and settings specific to the kind of sensor device being modeled. The graphical program may then automatically generate a model of the sensor device based on the configuration specified by the user, e.g., a SPICE model or other model suitable for use in an electronic circuit simulation environment. Generating the model may include creating a representation of the circuitry of the sensor device, e.g., based on the type of sensor device and the physical properties or settings selected by the user. Generating the model may also include scaling electrical signals used in the circuitry appropriately to match the physical properties selected by the user. Thus, the user may be able to interact with the graphical user interface in terms of the physical characteristics of the sensor device properties, and the graphical program may automatically handle the task of creating an equivalent circuit. This may enable users who are not skilled in SPICE or electronic circuit design to easily create an accurate circuit model of a sensor device.

Generating the model may comprise including control mechanisms in the model to enable the model to be dynamically changed during a simulation, e.g., by adjusting one or more voltage controlled sources or current controlled sources to scale them to match a change in one or more physical properties of the sensor device specified by the user, as described below.

In some embodiments the graphical program may be able to receive the sensor configuration information for the sensor device in different ways other than through user input to a graphical user interface. For example, the manufacturer of a particular sensor device may provide a technical datasheet specifying information about the physical properties of the sensor device. In some embodiments the graphical user interface may enable the user to select a datasheet for a certain sensor device, and the graphical program may create the model based on the selected datasheet, e.g., to accurately model that specific sensor device. In some embodiments the graphical program may also populate the fields of the graphical user interface or scale the values shown in the graphical user interface to match the properties specified in the datasheet, and the user may then possibly modify one or more of the properties before requesting the model to be generated.

Figure 7:
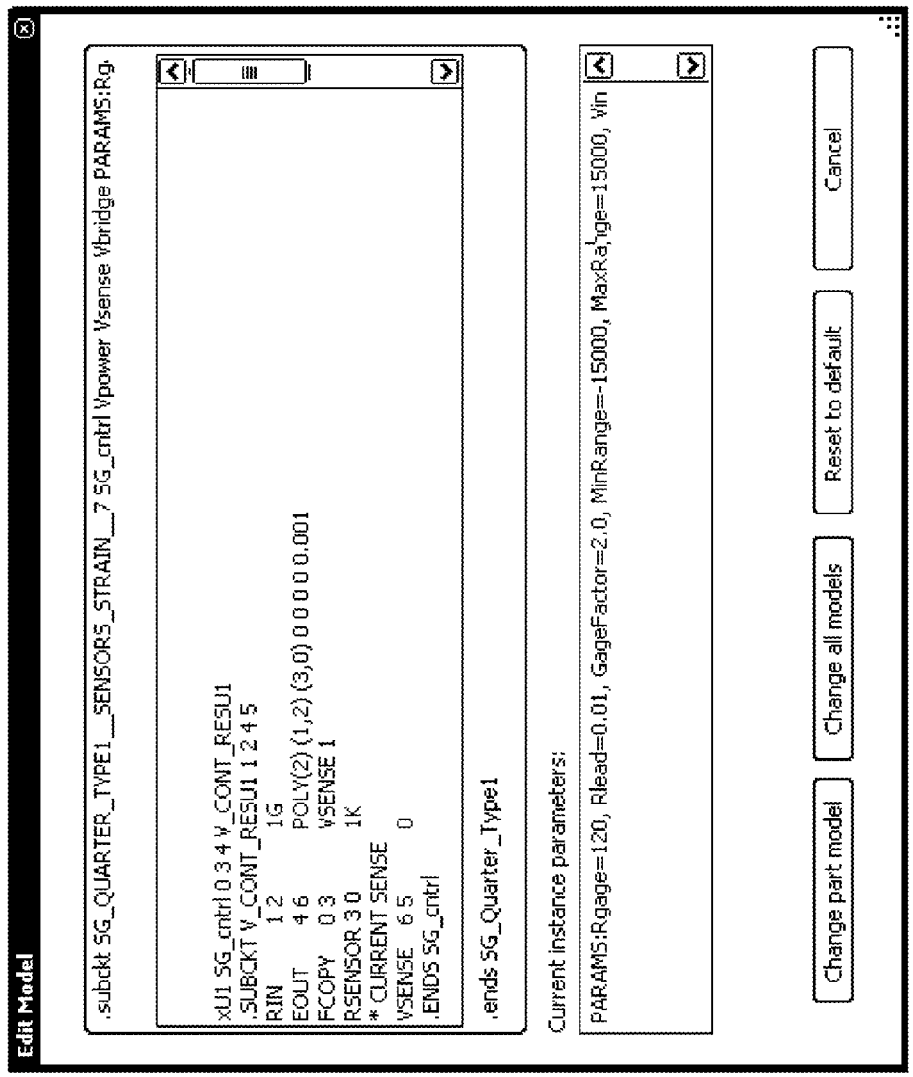
FIG. 7 illustrates an example of a portion of text information defining a SPICE model of a strain gauge device created in response to user input to the graphical user interface of FIG. 6.

The model of the sensor device may be specific to the kind of simulation environment in which the model will be used. FIG. 7 illustrates an example of a portion of text information defining a SPICE model of a strain gauge device created in response to user input to the graphical user interface of FIG. 6.

In some embodiments, generating the model of the sensor device may include automatically creating a component representing the model and saving the component in a component library or database. The user may then be able to select the component from the library and include it in various circuit designs to be simulated.

Figure 8:
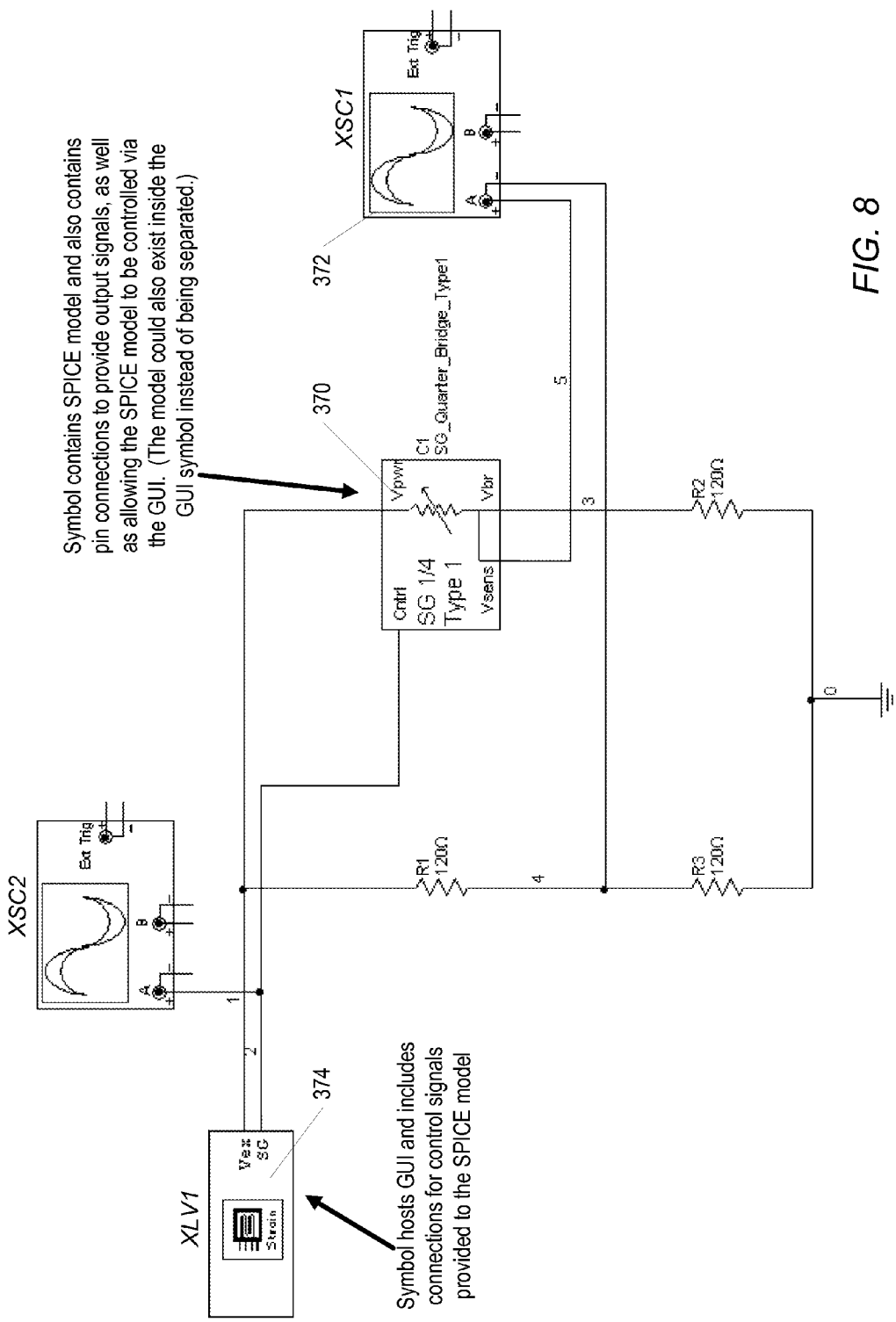
FIG. 8 illustrates a circuit diagram created by a user, where the circuit diagram includes a component that represents a model of a sensor device.

As indicated in block 306 of the flowchart, after the model of the sensor device has been generated, a SPICE simulation or other electrical circuit simulation may be performed using the model in the simulation environment implemented by the simulation application 100, e.g., to simulate the circuitry of the sensor device. In some embodiments, before performing the simulation, the user may configure the simulation to also model other circuitry or devices in addition to the sensor device, e.g., other circuitry that uses an output signal produced by the sensor device. In some embodiments the simulation application 100 may enable the user to design a circuit graphically. For example, FIG. 8 illustrates a circuit diagram created by a user by interacting with the user interface of a Multisim simulation application. The circuit diagram includes a component 370 which represents the sensor device model that was automatically generated by the graphical program 102. For example, the user may have selected the component 370 from a component library where it was saved by the graphical program 102 and requested the component 370 to be included in the circuit diagram. In this example, the component 370 is wired to another component 372 which represents a model of a measurement device which receives the signal produced by the sensor device model.

In some embodiments, the graphical program 102 which created the model may be executed together with the simulation application 100 during the simulation. As indicated in block 307 of the flowchart, user input may be received via the graphical user interface of the graphical program 102 during the simulation to specify a change in one or more of the physical properties of the sensor device. In response, the graphical program 102 may communicate with the simulation application 100 to modify the model of the sensor device during the simulation by adjusting the circuitry represented by the model or adjusting one or more electrical signals used in the circuitry to simulate the change in the one or more physical properties of the sensor device, as indicated in block 309. For example, when the model was generated, the graphical program 102 may have caused the model to have one or more control signal lines that can be controlled by the graphical program 102 via external control pins during the simulation.

The graphical user interface may enable the user to modify the physical properties of the sensor device without concerning himself with the details of how the electrical circuitry of the model needs to be changed to implement the modification. For example, a physical property modified by the user may be measured in a particular physical unit of measurement, and the user input may specify a change in quantity of the physical property in terms of the first physical unit of measurement. The graphical program 102 may communicate with the simulation application 100 to modify the model of the sensor device by scaling one or more electrical signals used by the model in order to match the change in quantity of the physical property in terms of the first physical unit of measurement. In some embodiments the model may be modified by adjusting one or more of a voltage controlled source or a current controlled source to simulate the change in the one or more of physical properties of the sensor device.

Figure 9:
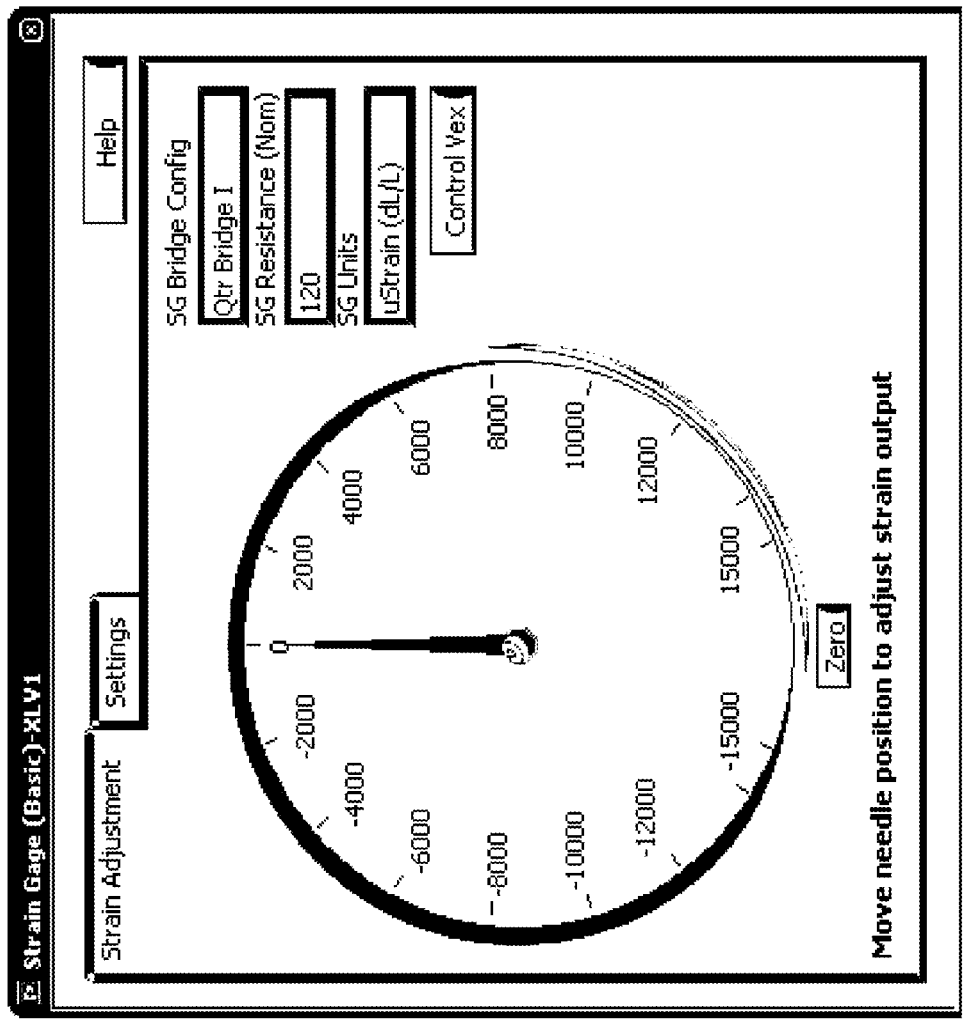
FIG. 9 illustrates an example of a graphical user interface with which a user may interact during a simulation to control a model of a strain gauge device.

FIG. 9 illustrates an example of a graphical user interface with which the user may interact during the simulation to control a model of a strain gauge device. The user can adjust physical properties of the strain gauge device, such as the nominal resistance, for example. In response, the graphical program 102 may communicate with the simulation application 100 to modify the model of the strain gauge device to reflect the user's changes.

As indicated in block 311, the graphical program 102 may also update the graphical user interface to display scaled values based on the changes the user specified in the one or more physical properties of the sensor device. For example, in the graphical user interface of FIG. 9, the values displayed in the dial may need to be re-scaled to correspond to a new nominal resistance value specified by the user.

Referring again to the circuit diagram of FIG. 8, the diagram also includes a component 374 that represents the graphical program 102. The component 374 is wired to the component 370 that represents the sensor device model to visually indicate that the graphical program 102 can provide controlling signals to the sensor device model to change the model during the simulation. In other embodiments, the sensor device model may be embedded in the component 374 that represents the graphical program 102 without being displayed in the diagram as a separate component.

It is noted that the description above refers to particular embodiments of the system and method for creating and controlling a model of a sensor device, and numerous alternative embodiments are contemplated. For example, in some embodiments different graphical programs may be used to create and modify the sensor device model. For example, one graphical program may create the model, and another graphical program may interact with the simulation application 100 during the simulation to adjust the model. In other embodiments, the program(s) which creates and adjusts the model may not be a graphical program, but may be implemented or developed using a text-based programming methodology or other type of programming environment. In other embodiments, the functionality of automatically generating and adjusting the sensor device model may be performed by the simulation application 100, e.g., so that the simulation application 100 does not interact with another program or application to implement this functionality.

Figure 10:
FIG. 10 is a block diagram of a computer accessible storage medium storing program instructions.

Turning now to FIG. 10, a block diagram of a computer accessible storage medium 500 is shown. The computer accessible storage medium 500 may store program instructions implementing the simulation application 100 and/or the graphical program 102. The instructions may be executable by one or more processors to perform the functions described above. Generally, the computer accessible storage medium 500 may store any set of instructions which, when executed, implement a portion or all of the functions described herein of the simulation application 100 and/or the graphical program 102.

Generally speaking, a computer accessible storage medium may include any storage media accessible by a computer during use to provide instructions and/or data to the computer. For example, a computer accessible storage medium may include storage media such as magnetic or optical media, e.g., disk (fixed or removable), tape, CD-ROM, DVD-ROM, CD-R, CD-RW, DVD-R, DVD-RW, or Blu-Ray. Storage media may further include volatile or non-volatile memory media such as RAM (e.g. synchronous dynamic RAM (SDRAM), Rambus DRAM (RDRAM), static RAM (SRAM), etc.), ROM, Flash memory, non-volatile memory (e.g. Flash memory) accessible via a peripheral interface such as the Universal Serial Bus (USB) interface, a flash memory interface (FMI), a serial peripheral interface (SPI), etc. Storage media may include microelectromechanical systems (MEMS), as well as storage media accessible via a communication medium such as a network and/or a wireless link. A carrier medium may include computer accessible storage media as well as transmission media such as wired or wireless transmission.

Although the embodiments above have been described in considerable detail, numerous variations and modifications will become apparent to those skilled in the art once the above disclosure is fully appreciated. It is intended that the following claims be interpreted to embrace all such variations and modifications.

I claim:

1. A method comprising:
   receiving sensor information specifying properties of a sensor device;
   automatically generating a SPICE model of the sensor device using sensor information;
   performing an electrical circuit simulation using the SPICE model of the sensor device;
   receiving user input via a graphical user interface during the simulation specifying a change in one or more physical properties of the sensor device; and
   modifying the SPICE model of the sensor device during the simulation to simulate the change in the one or more physical properties of the sensor device.

2. The method of claim 1, further comprising:
   executing a graphical program during the simulation, wherein the graphical program includes a plurality of interconnected nodes that visually indicate functionality of the graphical program, wherein the graphical user interface is implemented by the graphical program;
   wherein the graphical program executes to adjust one or more electrical signals in the simulation to simulate the change in the one or more physical properties of the sensor device.

3. The method of claim 2, wherein the method further comprises:
   displaying a circuit diagram including a first icon representing the SPICE model of the sensor device and a second icon representing the graphical program, wherein the second icon is wired to the first icon to visually indicate that the graphical program can modify the SPICE model of the sensor device.

4. The method of claim 1,
   wherein the one or more physical properties of the sensor device include a first physical property measured in a first physical unit of measurement, wherein the user input specifies a change in quantity of the physical property in terms of the first physical unit of measurement;
   wherein modifying the SPICE model of the sensor device comprises scaling one or more electrical signals to match the change in quantity of the physical property in terms of the first physical unit of measurement.

5. The method of claim 1,
   wherein receiving the user input specifying the change in the one or more physical properties of the sensor device comprises receiving user input specifying a change in a first physical property of the sensor device;
   wherein the method further comprises computing scaled values of one or more other physical properties of the sensor device in response to the user input specifying the change in the first physical property, and updating the graphical user interface to display the scaled values of the one or more other physical properties.

6. The method of claim 1,
   wherein the graphical user interface enables a user to select from a plurality of sensor types for the sensor device, wherein the SPICE model of the sensor device represents a first sensor type;
   wherein receiving the user input specifying the change in the one or more physical properties of the sensor device comprises receiving user input selecting a second sensor type from the plurality of sensor types, wherein modifying the SPICE model of the sensor device comprises changing one or more physical properties of the sensor device to represent the second sensor type.

7. The method of claim 1,
   wherein the sensor device is configured to output one or more output signals, wherein the method further comprises:
   displaying a circuit diagram including a first component representing the SPICE model of the sensor device, wherein the first component is wired to one or more other components in the circuit diagram to visually indicate that the one or more output signals of the sensor device are provided as input to the one or more other components.

8. The method of claim 1, further comprising:
   executing a graphical program during the simulation, wherein the graphical program includes a plurality of interconnected nodes that visually indicate functionality of the graphical program, wherein the graphical user interface is implemented by the graphical program, wherein the graphical program executes to modify the SPICE model of the sensor device to simulate the change in the one or more physical properties of the sensor device; and
   displaying a circuit diagram including a first icon representing both the graphical program and the SPICE model of the sensor device.

9. The method of claim 1,
   wherein modifying the SPICE model of the sensor device comprises adjusting one or more of a voltage controlled source or a current controlled source during the simulation to simulate the change in the one or more physical properties of the sensor device.

10. The method of claim 1,
wherein modifying the SPICE model of the sensor device comprises modifying circuitry represented by the SPICE model of the sensor device to simulate the change in the one or more physical properties of the sensor device.

11. The method of claim 1,
wherein receiving the sensor information specifying the properties of the sensor device includes receiving a datasheet for the sensor device, wherein the SPICE model of the sensor device is automatically generated using the datasheet.

12. The method of claim 1,
wherein receiving the sensor information specifying the properties of the sensor device includes receiving the sensor information via the graphical user interface.

13. The method of claim 1, wherein performing the electrical circuit simulation using the SPICE model of the sensor device comprises performing a SPICE simulation using the SPICE model of the sensor device.

14. The method of claim 1, wherein the sensor device comprises one or more of:
   a strain gauge device;
   a thermocouple device;
   a thermistor device;
   an accelerometer device;
   a load cell device;
   a light sensor device.

15. A non-transitory computer accessible storage medium storing program instructions executable by one or more processors to:
   receive sensor information specifying properties of a sensor device;
   automatically generate a SPICE model of the sensor device using the sensor information;
   perform an electrical circuit simulation using the SPICE model of the sensor device;
   receive user input via a graphical user interface during the simulation specifying a change in one or more physical properties of the sensor device; and
   modify the SPICE model of the sensor device during the simulation to simulate the change in the one or more physical properties of the sensor device.

16. The non-transitory computer accessible storage medium of claim 15,
   wherein the one or more physical properties of the sensor device include a first physical property measured in a first physical unit of measurement, wherein the user input specifies a change in quantity of the physical property in terms of the first physical unit of measurement;
   wherein modifying the SPICE model of the sensor device comprises scaling one or more electrical signals to match the change in quantity of the physical property in terms of the first physical unit of measurement.

17. A system comprising:
   one or more processors; and
   memory storing program instructions, wherein the program instructions are executable by the one or more processors to:
   receive sensor information specifying properties of a sensor device;
   automatically generate a SPICE model of the sensor device using the sensor information;
   perform an electrical circuit simulation using the SPICE model of the sensor device;
   receive user input via a graphical user interface during the simulation specifying a change in one or more physical properties of the sensor device; and
   modify the SPICE model of the sensor device during the simulation to simulate the change in the one or more physical properties of the sensor device.

18. The system of claim 17,
   wherein the one or more physical properties of the sensor device include a first physical property measured in a first physical unit of measurement, wherein the user input specifies a change in quantity of the physical property in terms of the first physical unit of measurement;
   wherein modifying the SPICE model of the sensor device comprises scaling one or more electrical signals to match the change in quantity of the physical property in terms of the first physical unit of measurement.

* * * * *